(12) United States Patent
Kallaher et al.

(10) Patent No.: US 11,417,728 B2
(45) Date of Patent: Aug. 16, 2022

(54) SELECTIVE AREA GROWTH WITH IMPROVED SELECTIVITY FOR NANOWIRES

(71) Applicant: Microsoft Technology Licensing, LLC, Redmond, WA (US)

(72) Inventors: Raymond L. Kallaher, West Lafayette, IN (US); Sergei V. Gronin, West Lafayette, IN (US); Geoffrey C. Gardner, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 256 days.

(21) Appl. No.: 16/799,973

(22) Filed: Feb. 25, 2020

(65) Prior Publication Data

US 2021/0265463 A1     Aug. 26, 2021

(51) Int. Cl.
*H01L 29/06*     (2006.01)
*B82Y 30/00*     (2011.01)
*B82Y 40/00*     (2011.01)
*H01L 21/02*     (2006.01)
*H01L 27/18*     (2006.01)

(52) U.S. Cl.
CPC .......... *H01L 29/0669* (2013.01); *B82Y 30/00* (2013.01); *B82Y 40/00* (2013.01); *H01L 21/02603* (2013.01); *H01L 27/18* (2013.01)

(58) Field of Classification Search
None
See application file for complete search history.

(56) References Cited

U.S. PATENT DOCUMENTS

| 8,030,108 | B1 | 10/2011 | Lee et al. |
| 2020/0279845 | A1* | 9/2020 | Ma .................... H01L 29/66742 |

OTHER PUBLICATIONS

Goosney, et al., "InSb Nanowires for Multispectral Infrared Detection", In Journal of Semiconductor Science and Technology, vol. 34, Issue 3, Feb. 20, 2019, 7 Pages.

(Continued)

*Primary Examiner* — Evren Seven
(74) *Attorney, Agent, or Firm* — Withrow & Terranova, P.L.L.C.

(57) ABSTRACT

A nanowire structure includes a substrate, a patterned mask layer, and a nanowire. The patterned mask layer includes an opening through which the substrate is exposed. Further, the patterned mask layer has a thermal conductivity greater than $$20\frac{W}{m*K}.$$

The nanowire is on the substrate in the opening of the patterned mask layer. By providing the patterned mask layer with a thermal conductivity greater than $$20\frac{W}{m*K},$$

the patterned mask layer is able to maintain a temperature of the surface thereof to a desired level when the nanowire is provided. This prevents undesired parasitic growth on the patterned mask layer, thereby improving the performance of the nanowire structure.

18 Claims, 7 Drawing Sheets

(56) References Cited

OTHER PUBLICATIONS

Kobayashi, et al., "Selective-Area Growth of InAs Nanowires with Metal/Dielectric Composite Mask and Their Application to Vertical Surrounding-Gate Field-Effect Transistors", In Journal of Applied Physics Express, vol. 6, Issue 4, Mar. 19, 2013, 5 Pages.

"International Search Report and Written Opinion Issued in PCT Application No. PCT/US2021/012127", dated May 4, 2021, 25 Pages.

Schuster, et al., "Position-Controlled Growth of GaN Nanowires and Nanotubes on Diamond by Molecular Beam Epitaxy", In Journal of Nano letters, vol. 15, Issue 3, Mar. 11, 2015, pp. 1773-1779.

\* cited by examiner

SELECTIVE AREA GROWTH WITH IMPROVED SELECTIVITY FOR NANOWIRES

FIELD OF THE DISCLOSURE

The present disclosure is related to nanowires, and in particular to nanowires with reduced parasitic growth and methods for manufacturing the same.

BACKGROUND

Nanowires show great promise for applications in quantum computing. Unfortunately, it is difficult to manufacture high quality nanowires. Conventional processes for manufacturing nanowires include selective-area-growth (SAG) wherein nanowires are selectively grown directly on a substrate through openings in a patterned mask layer. In such a process, it is desirable for the nanowires to grown only on the substrate through the openings in the patterned mask layer and not on the patterned mask layer itself. Material growth occurring on the patterned mask layer during growth of nanowires is referred to as parasitic growth. The degree to which the nanowires grow on the substrate and not on the patterned mask layer is referred to as selectivity. Current manufacturing techniques for nanowires result in an undesirably high degree of parasitic growth and thus an undesirable low degree of selectivity.

In light of the above, there is a need for nanowires with reduced parasitic growth and methods for manufacturing the same.

SUMMARY

In one embodiment, a nanowire structure includes a substrate, a patterned mask layer, and a nanowire. The patterned mask layer includes an opening through which the substrate is exposed. Further, the patterned mask layer has a thermal conductivity greater than $$20 \frac{W}{m*K}.$$

The nanowire is on the substrate in the opening of the patterned mask layer. By providing the patterned mask layer with a thermal conductivity greater than $$20 \frac{W}{m*K},$$

the patterned mask layer has a thermal conductivity comparable to, if not greater than the substrate's thermal conductivity and the temperature gradient in the mask layer is then comparable to that in the substrate. This leads to a negligible temperature drop across the mask and the temperature at the mask surface is then approximately equal to the temperature of the substrate at the growth surface. This prevents undesired parasitic growth on the patterned mask layer, thereby improving the performance and yield of the nanowire structure.

In one embodiment, the patterned mask layer has a thermal conductivity greater than $$40 \frac{W}{m*K}.$$

At this high of a thermal conductivity, the mask layer can have a thermal conductivity significantly greater than the substrate's and then additionally acts to improve the temperature uniformity across growth surface on the substrate. The patterned mask layer may comprise one or more of diamond, graphite, aluminum nitride, silicon carbide, and boron nitride. The nanowire may comprise one or more of indium arsenide, indium antimonide, and indium arsenide antimonide. The substrate may comprise one or more of gallium arsenide, gallium antimonide, indium phosphide, gallium phosphide, silicon, and germanium.

In one embodiment, the nanowire structure further includes a superconductor layer over the nanowire.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
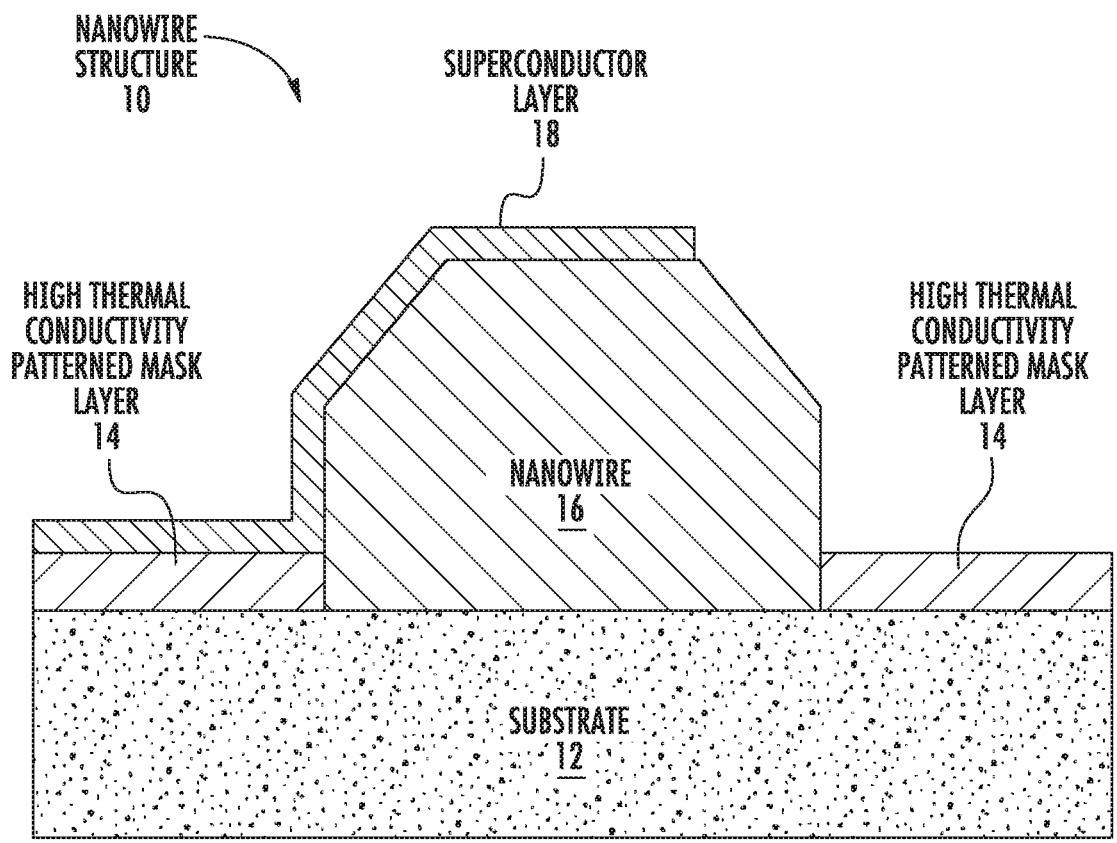
FIG. 1 is a diagram illustrating a nanowire structure according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a nanowire structure 10 according to one embodiment of the present disclosure. The nanowire structure 10 includes a substrate 12, a high thermal conductivity patterned mask layer 14 on the substrate 12, and a nanowire 16 on the substrate 12 through an opening in the high thermal conductivity patterned mask layer 14. Further, the nanowire structure 10 may include a superconductor layer 18 on the nanowire 16. In some embodiments, the superconductor layer 18 may extend over a portion of the high thermal conductivity patterned mask layer 14.

In one embodiment, the high thermal conductivity patterned mask layer 14 has a thermal conductivity greater than $$20 \frac{W}{m*K} \text{(Watts per meter} - \text{Kelvin)}.$$

In some embodiment, this thermal conductivity may be valid at temperatures between 400° C. and 700° C., which are typical temperatures used for growth of nanowires. In additional embodiments, the high thermal conductivity patterned mask layer 14 has a thermal conductivity greater than $$40 \frac{W}{m*K}.$$

The high thermal conductivity patterned mask layer may comprise, for example, diamond $$\left(600 - 2000 \frac{W}{m*K}\right) - \text{including crystalline,}$$

polycrystalline, nanocrystalline, and ultra-nanocrystalline diamond, graphite $$\left(170 \frac{W}{m*K}\right),$$

aluminum nitride $$\left(300 \frac{W}{m*K}\right),$$

silicon carbide $$\left(400 \frac{W}{m*K}\right),$$

and boron nitride $$\left(700 \frac{W}{m*K}\right).$$

A thickness of the high thermal conductivity patterned mask layer 14 may be between 1 nm and 10 microns. By providing the high thermal conductivity patterned mask layer 14 with a thermal conductivity greater than $$20 \frac{W}{m*K},$$

a temperature of the exposed surface of the high thermal conductivity patterned mask layer 14 may remain high during a growth process of the nanowire 16 as discussed in detail below. By maintaining a high temperature at the exposed surface of the high thermal conductivity patterned mask layer 14 during the growth of the nanowire 16, parasitic growth on the high thermal conductivity patterned mask layer 14 may be reduced and selectivity improved. This in turn may improve the overall performance and yield of the nanowire structure 10.

The nanowire 16 may comprise one of indium arsenide, indium antimonide, and indium arsenide antimonide. While shown as a single layer, the nanowire 16 may comprise several layers in some embodiments. The nanowire 16 may have a thickness between 20 nm and 300 nm. Further, the nanowire 16 may have a diameter on the order of a nanometer ($10^{-9}$ meters) or a ratio of length to width greater than 1000. The substrate 12 may comprise one or more of gallium arsenide, gallium antimonide, gallium arsenide antimonide, indium phosphide, silicon, and germanium. The superconductor layer 18 may comprise one of aluminum, lead, niobium, indium, tin, and vanadium. A thickness of the superconductor layer 18 may be between 3 nm and 30 nm.

Figure 2:
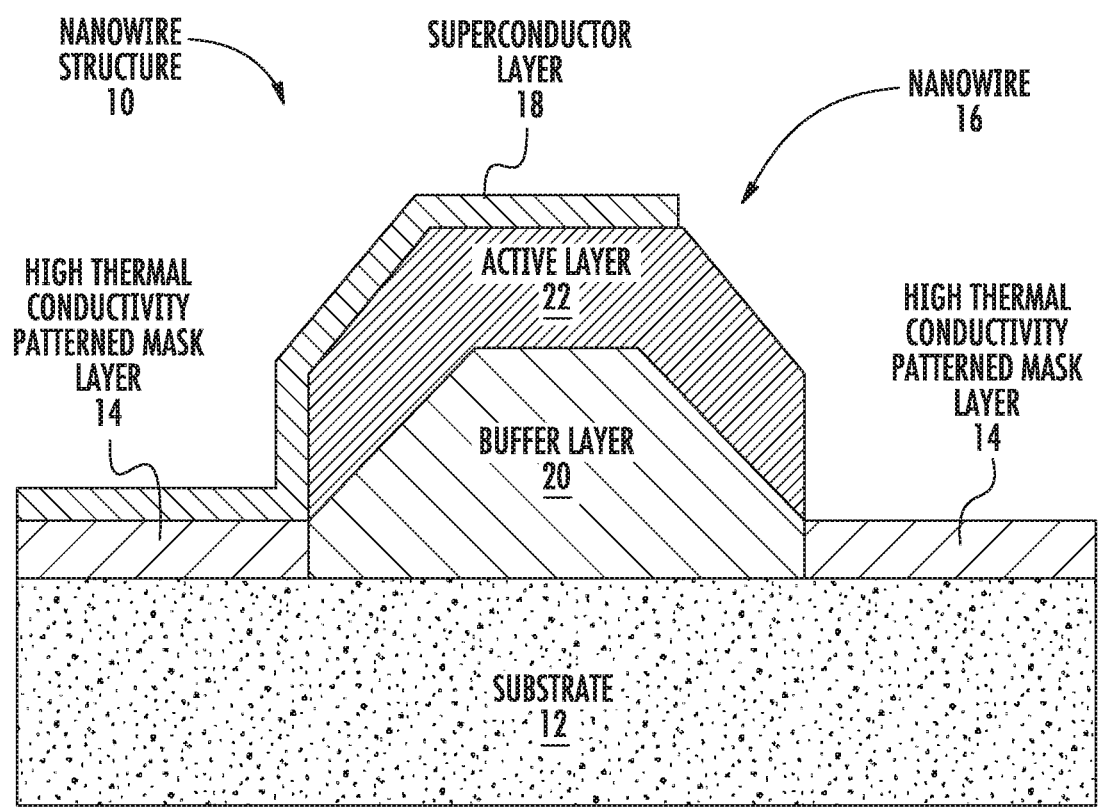
FIG. 2 is a diagram illustrating a nanowire structure according to one embodiment of the present disclosure.

As discussed above, the nanowire 16 may comprise a number of layers. For example, as shown in FIG. 2 the nanowire 16 may include a buffer layer 20 on the substrate 12 through the opening in the high thermal conductivity patterned mask layer 14 and an active layer 22 on the buffer layer 20. The buffer layer 20 may comprise one or more of gallium arsenide antimonide, indium gallium arsenide, aluminum antimonide, indium aluminum antimonide, and indium aluminum arsenide. The active layer 22 may comprise one of indium arsenide, indium antimonide, and indium arsenide antimonide. The buffer layer 20 may have a thickness between 0 nm and 10 microns. The active layer 22 may have a thickness between 3_nm and 200 nm.

Figure 3:
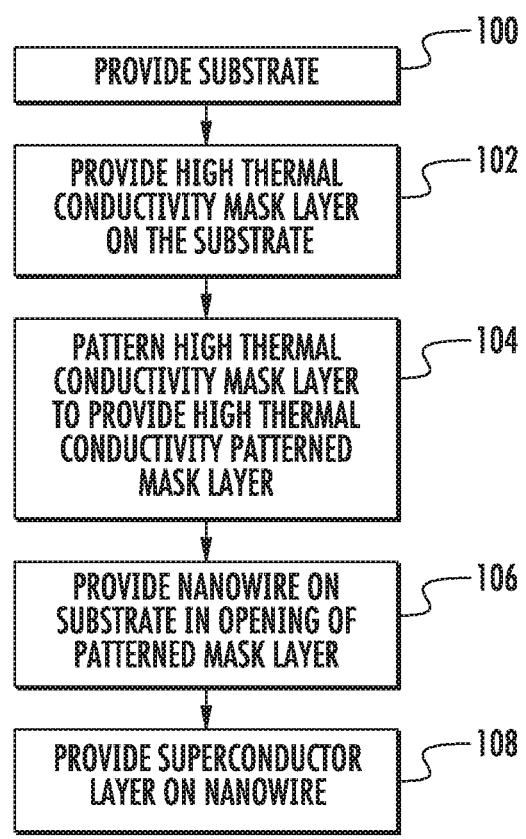
FIG. 3 is a flow diagram illustrating a method for manufacturing a nanowire structure according to on embodiment of the present disclosure.
Figure 4A:
FIGS. 4A through 4E are diagrams illustrating a method for manufacturing a nanowire structure according to one embodiment of the present disclosure.
Figure 4B:
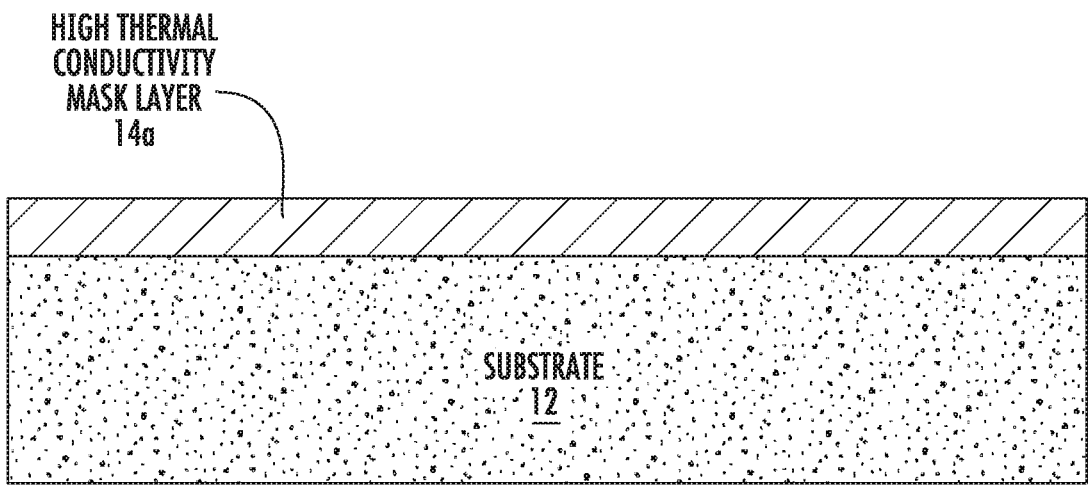
Figure 4C:
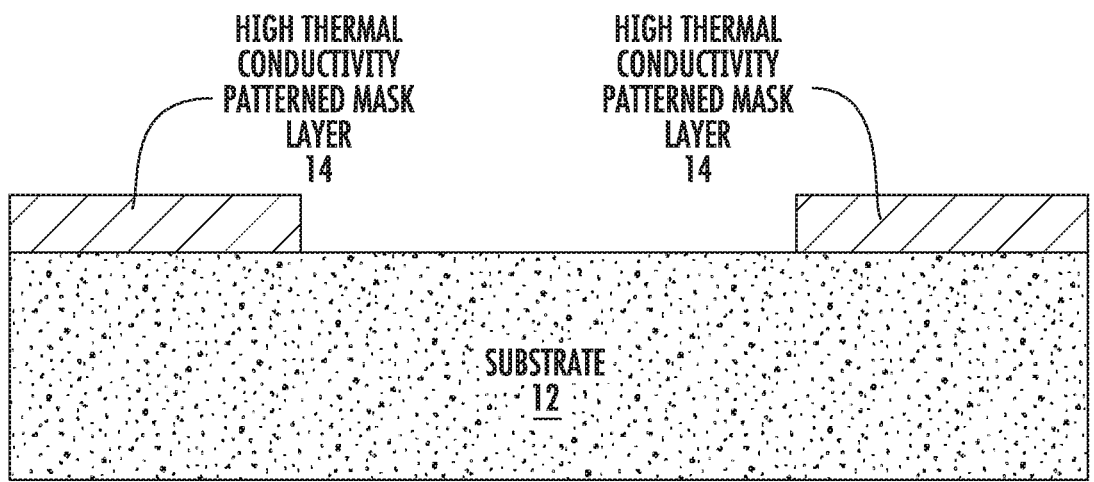
Figure 4D:
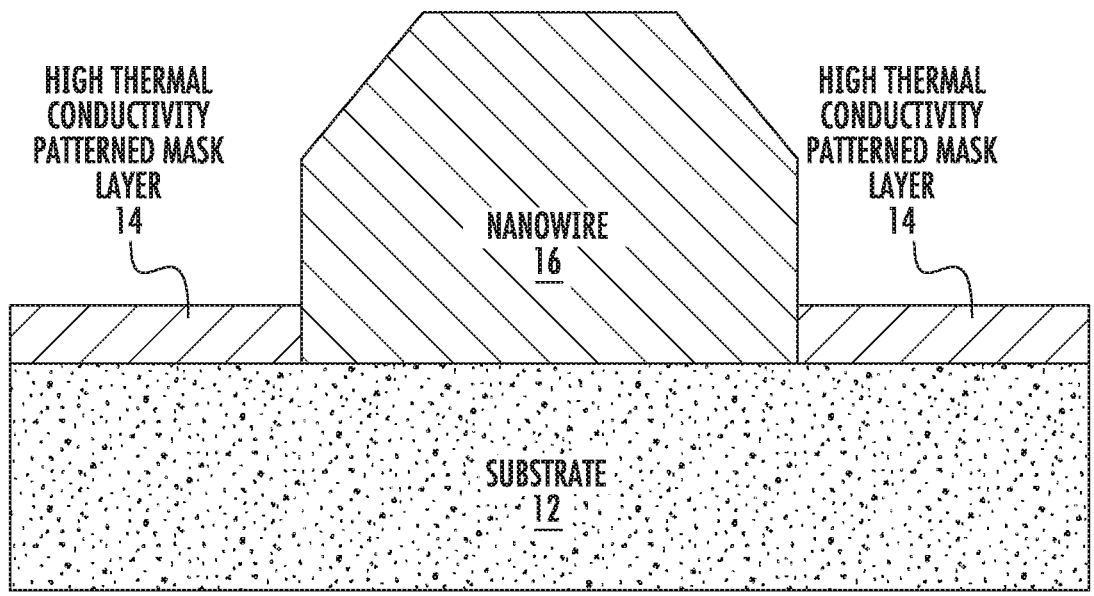
Figure 4E:
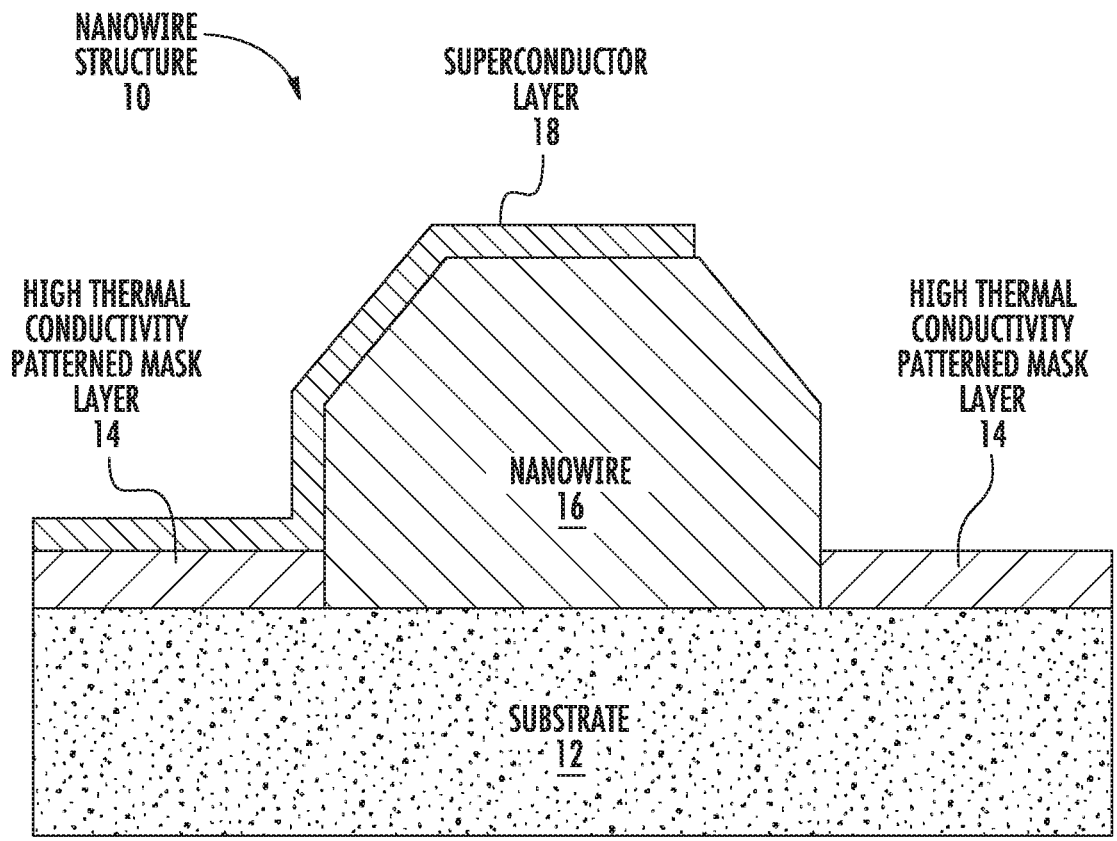

FIG. 3 is a flow diagram illustrating a method for manufacturing the nanowire structure 10 according to one embodiment of the present disclosure. FIGS. 4A through 4E illustrate the method of FIG. 3 and thus are discussed together with FIG. 3. The substrate 12 is provided (block 100 and FIG. 4A). A high thermal conductivity mask layer 14a is provided on the substrate (block 102 and FIG. 4B). As shown in FIG. 4B, the high thermal conductivity mask layer 14a is provided as a blanket layer over the substrate 12. The high thermal conductivity mask layer 14a is patterned (block 104 and FIG. 4C) to form the high thermal conductivity patterned mask layer 14. Patterning the high thermal conductivity mask layer 14a may be performed by any suitable process. For example, the high thermal conductivity mask layer 14a may be patterned by a lithography process such as an electron beam lithography process. The nanowire 16 is provided on the substrate 12 through an opening in the high thermal conductivity patterned mask layer 14 (block 106 and FIG. 4D). The nanowire 16 may be provided by any suitable process, but in some embodiments is provided by a SAG process as discussed in detail below. The superconductor layer 18 is provided on the nanowire 16 (block 108 and FIG. 4E), and in some embodiments, on a portion of the high thermal conductivity patterned mask layer 14.

Figure 5:
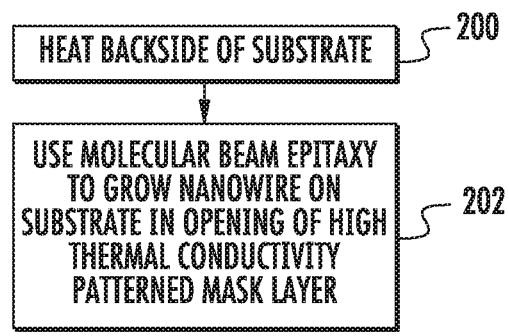
FIG. 5 is a flow diagram illustrating details of a method for manufacturing a nanowire structure according to one embodiment of the present disclosure.
Figure 6A:
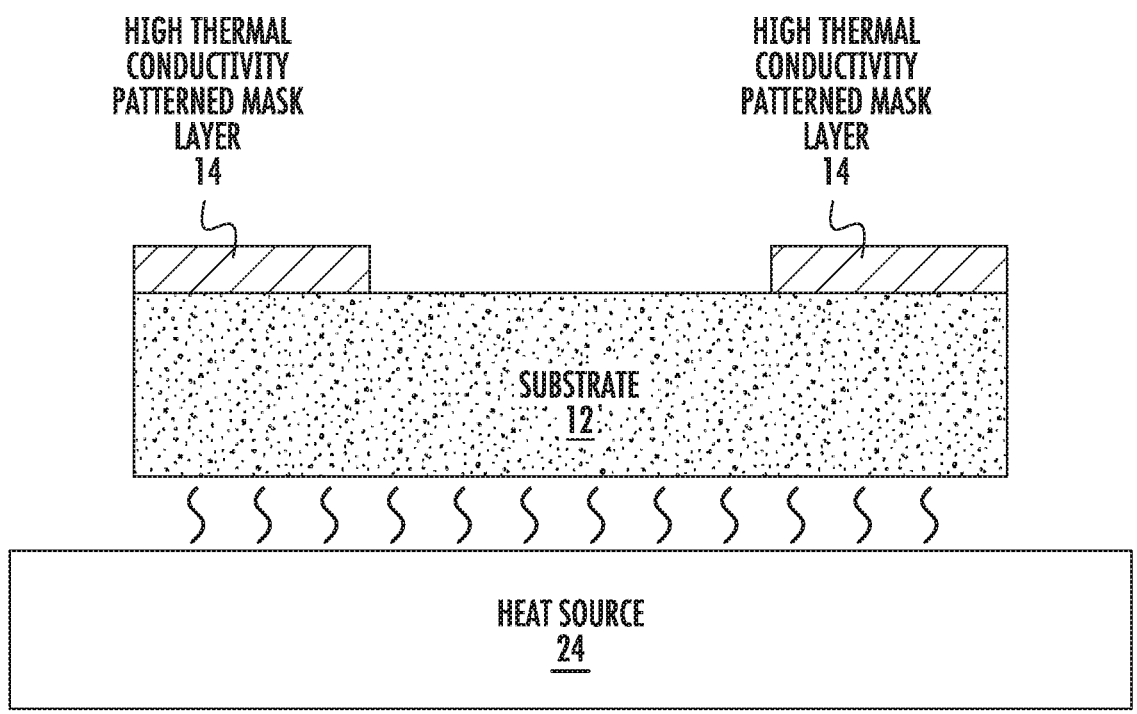
FIGS. 6A and 6B are diagrams illustrating details of a method for manufacturing a nanowire structure according to one embodiment of the present disclosure.
Figure 6B:
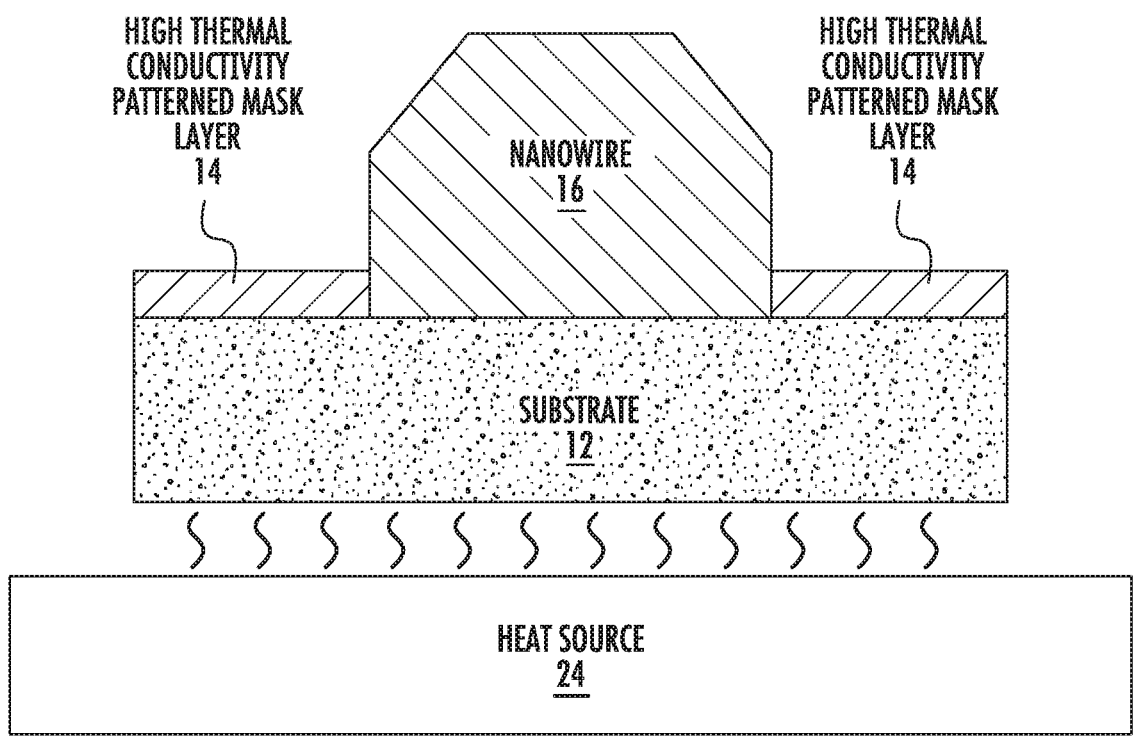

FIG. 5 is a flow diagram illustrating details of providing the nanowire 16 on the substrate 12 through the opening in the high thermal conductivity patterned mask layer 14 according to one embodiment of the present disclosure. FIGS. 6A and 6B illustrate the method of FIG. 5 and thus are discussed together with FIG. 5. The backside of the substrate 12 is heated (block 200 and FIG. 6A). As discussed herein, the backside of the substrate 12 is the side of the substrate 12 opposite the high thermal conductivity patterned mask layer 14. The backside of the substrate 12 may be heated in any suitable way, and in one embodiment is heated by direct contact with a heat source 24. The heat source 24 may be any suitable heat source. The nanowire 16 is then grown on the substrate 12 through the opening of the high thermal conductivity patterned mask layer 14 via molecular beam epitaxy (block 202 and FIG. 6B). By using the high thermal conductivity patterned mask layer 14, the surface of the high thermal conductivity patterned mask layer 14 opposite the substrate 12 conducts heat provided from the heat source 24 and remains at a relatively high temperature. The high temperature of the surface of the high thermal conductivity patterned mask layer 14 reduces or prevents parasitic growth from the nanowire 16 and therefore improves selectivity. Accordingly, the performance of the nanowire structure 10 may be improved.

Those skilled in the art will recognize improvements and modifications to the preferred embodiments of the present disclosure. All such improvements and modifications are considered within the scope of the concepts disclosed herein and the claims that follow.

What is claimed is:

1. A nanowire structure comprising:
   a substrate;
   a patterned mask layer on the substrate, wherein:
     the patterned mask layer has an opening through which the substrate is exposed; and
     the patterned mask layer comprises one or more of diamond, graphite, aluminum nitride, silicon carbide, and boron nitride; and
   a nanowire on the substrate in the opening of the patterned mask layer.

2. The nanowire structure of claim 1 wherein the nanowire is grown on the substrate by a selective area growth (SAG) process.

3. The nanowire structure of claim 2 wherein the nanowire comprises one of indium arsenide, indium antimonide, and indium arsenide antimonide.

4. The nanowire structure of claim 1 wherein the nanowire comprises one of indium arsenide, indium antimonide, and indium arsenide antimonide.

5. The nanowire structure of claim 4 wherein the substrate comprises one or more of gallium arsenide, gallium antimonide, indium phosphide, gallium phosphide, silicon, and germanium.

6. The nanowire structure of claim 1 wherein the nanowire includes a plurality of layers including a buffer layer on the substrate and an active layer on the buffer layer.

7. The nanowire structure of claim 6 wherein:
   the buffer layer comprises one or more of gallium arsenide antimonide, indium gallium arsenide, aluminum antimonide, indium aluminum antimonide, and indium aluminum arsenide; and
   the active layer comprises one of indium arsenide, indium antimonide, and indium arsenide antimonide.

8. The nanowire structure of claim 1 further comprising a superconductor layer on the nanowire.

9. A method for manufacturing a nanowire structure, the method comprising:
   providing a substrate;
   providing a patterned mask layer on the substrate, wherein:
     the patterned mask layer has an opening through which the substrate is exposed; and
     the patterned mask layer comprises one or more of diamond, graphite, aluminum nitride, silicon carbide, and boron nitride; and
   providing a nanowire on the substrate in the opening of the patterned mask layer.

10. The method of claim 9 wherein providing the nanowire comprises growing the nanowire via a selective area growth (SAG) process.

11. The method of claim 10 wherein the nanowire comprises one of indium arsenide, indium antimonide, and indium arsenide antimonide.

12. The method of claim 9 wherein the nanowire comprises one of indium arsenide, indium antimonide, and indium arsenide antimonide.

13. The method of claim 12 wherein the substrate comprises one or more of gallium arsenide, gallium antimonide, indium phosphide, gallium phosphide, silicon, and germanium.

14. The method of claim 9 wherein providing the nanowire comprises:
providing a buffer layer on the substrate in the opening of the patterned mask layer; and
providing an active layer on the buffer layer.

15. The method of claim 14 wherein:
the buffer layer comprises one or more of gallium arsenide antimonide, indium gallium arsenide, aluminum antimonide, indium aluminum antimonide, and indium aluminum arsenide; and
the active layer comprises one of indium arsenide, indium antimonide, and indium arsenide antimonide.

16. The method of claim 14 further comprising providing a superconductor layer on the active layer.

17. The nanowire structure of claim 1 wherein the patterned mask layer comprises one or more of crystalline diamond, polycrystalline diamond, nanocrystalline diamond, and ultra-nanocrystalline diamond.

18. The method of claim 9 wherein the patterned mask layer comprises one or more of crystalline diamond, polycrystalline diamond, nanocrystalline diamond, and ultra-nanocrystalline diamond.

* * * * *